(12) United States Patent
Lee et al.

(10) Patent No.: US 9,679,920 B2
(45) Date of Patent: Jun. 13, 2017

(54) LIQUID CRYSTAL DISPLAY

(71) Applicant: Samsung Display Co., Ltd., Yongin (KR)

(72) Inventors: Hyun Sup Lee, Hwaseong-si (KR); Jun Ho Song, Seongnam-si (KR); Jung-Hun Noh, Yongin-si (KR); Keun Kyu Song, Seoul (KR); Sang-Hee Jang, Bucheon-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 0 days.

(21) Appl. No.: 14/744,943

(22) Filed: Jun. 19, 2015

(65) Prior Publication Data
US 2015/0370138 A1 Dec. 24, 2015

(30) Foreign Application Priority Data

Jun. 20, 2014 (KR) .................. 10-2014-0076077
May 15, 2015 (KR) .................. 10-2015-0068130

(51) Int. Cl.
*H01L 27/14* (2006.01)
*H01L 27/12* (2006.01)
*G02F 1/1343* (2006.01)
*G02F 1/1333* (2006.01)

(52) U.S. Cl.
CPC ........ *H01L 27/124* (2013.01); *G02F 1/13439* (2013.01); *G02F 1/133345* (2013.01); *G02F 1/134363* (2013.01); *G02F 2001/134372* (2013.01); *G02F 2201/40* (2013.01)

(58) Field of Classification Search
CPC ......... G02F 1/134363; G02F 1/133345; G02F 1/13439; G02F 2001/134372; H01L 27/124
See application file for complete search history.

(56) References Cited

U.S. PATENT DOCUMENTS

| 7,092,049 B2 | 8/2006 | Kadotani et al. | |
|---|---|---|---|
| 2005/0030451 A1 | 2/2005 | Liu | |
| 2006/0203169 A1* | 9/2006 | Ozawa | G02F 1/134363 349/141 |
| 2009/0073359 A1* | 3/2009 | Sonoda | G02F 1/133553 349/113 |
| 2012/0169985 A1* | 7/2012 | Kim | G02F 1/136227 349/139 |

(Continued)

FOREIGN PATENT DOCUMENTS

| JP | 3074101 | 6/2000 |
|---|---|---|
| KR | 100293431 | 4/2001 |

(Continued)

*Primary Examiner* — Ahmed Sefer
(74) *Attorney, Agent, or Firm* — Cantor Colburn LLP

(57) ABSTRACT

A liquid crystal display includes a first substrate, a gate line and a data line disposed on the first substrate, a first insulating layer disposed on the gate line and the data line, a first electrode disposed on the first insulating layer and having a flat form in a planar shape, a second insulating layer disposed on the first electrode, and a second electrode disposed on the second insulating layer and including a plurality of branch electrodes, where a width of a branch electrode of the plurality of branch electrodes is equal to or less than about 2 micrometers.

11 Claims, 17 Drawing Sheets

(56) References Cited

U.S. PATENT DOCUMENTS

2012/0218501 A1* 8/2012 Lee ................... G02F 1/134309
　　　　　　　　　　　　　　　　　　　　　349/139
2013/0214299 A1* 8/2013 Ryu ................... H01L 27/1225
　　　　　　　　　　　　　　　　　　　　　257/88
2013/0235311 A1　9/2013 Onaka et al.

FOREIGN PATENT DOCUMENTS

| KR | 1020050021121 | 3/2005 |
| KR | 100685937 | 2/2007 |
| KR | 1020100053169 | 5/2010 |
| KR | 1020100114235 | 10/2010 |
| KR | 1020110074037 | 6/2011 |
| KR | 1020110077259 | 7/2011 |
| KR | 1020130015187 | 2/2013 |

* cited by examiner

LIQUID CRYSTAL DISPLAY

This application claims priorities to Korean Patent Application No. 10-2014-0076077 filed on Jun. 20, 2014 and Korean Patent Application No. 10-2015-0068130 filed on May 15, 2015, and all the benefits accruing therefrom under 35 U.S.C. §119, the entire contents of which are incorporated herein by reference.

BACKGROUND (a) Field

The invention relates to a liquid crystal display.

(b) Description of the Related Art

A liquid crystal display ("LCD") is currently one of the most widely used flat panel displays, and is a display device that adjusts an amount of transmitted light by applying a voltage to an electrode and rearranging liquid crystal molecules of a liquid crystal layer.

The LCD has a merit in that it is easily manufactured to be thin, but has a drawback in that side visibility is poor compared to front visibility, and as a result, in order to overcome the drawback, various methods of arranging and driving the liquid crystal have been developed. An LCD, in which a pixel electrode and a common electrode are disposed on one substrate, attracts attention as a method of implementing a wide viewing angle.

In such an LCD, at least one of two field generating electrodes of the pixel electrode and the common electrode has a plurality of cutouts and a plurality of branch electrodes defined by the plurality of cutouts.

SUMMARY

In a case of an liquid crystal display ("LCD") using a plurality of branch electrodes, liquid crystal molecules are not well controlled in a center portion of the branch electrode such that transmittance is reduced.

The invention has been made in an effort to provide an LCD in which two field generating electrodes are disposed on a substrate, where at least one of the two field generating electrodes has a cutout to thus realize a wide viewing angle, and in which deterioration of transmittance that may occur at a center portion of a branch electrode in a high-resolution LCD may be prevented.

An exemplary embodiment of the invention provides an LCD including a first substrate, a gate line and a data line disposed on the first substrate, a first insulating layer disposed on the gate line and the data line, a first electrode disposed on the first insulating layer and having a flat form in a planar shape, a second insulating layer disposed on the first electrode, and a second electrode disposed on the second insulating layer and including a plurality of branch electrodes, where a width of the branch electrode is less than about 2 micrometers (μm).

A width of the branch electrode is equal to or less than about 1.5 μm.

The width of the branch electrode is equal to or less than about 1 μm.

A width of the branch electrode is equal to or less than about 0.5 μm.

A thickness of the branch electrode is equal to or less than about 4,000 angstroms (Å).

A thickness of the branch electrode is equal to or less than about 2,000 Å.

A ratio (W/S) of the width (W) of the branch electrode to the gap (S) between the two adjacent branch electrodes from among the branch electrodes is less than about 1.

The ratio (W/S) of the width (W) of the branch electrode to the gap (S) between the two adjacent branch electrodes from among the branch electrodes is between about 0.25 and about 1.

The branch electrodes are extended to be substantially parallel to the data line.

The branch electrodes include a first portion extended to be substantially parallel to the data line and a second portion provided at end portions of the branch electrodes and bent to have a predetermined angle from the first portion.

According to the embodiment of the invention, the two field generating electrodes are disposed on one substrate, at least one of the two field generating electrodes is provided to have a cutout and thereby realize a wide viewing angle, and deterioration of transmittance that may occur at the center portion of the branch electrode is prevented.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
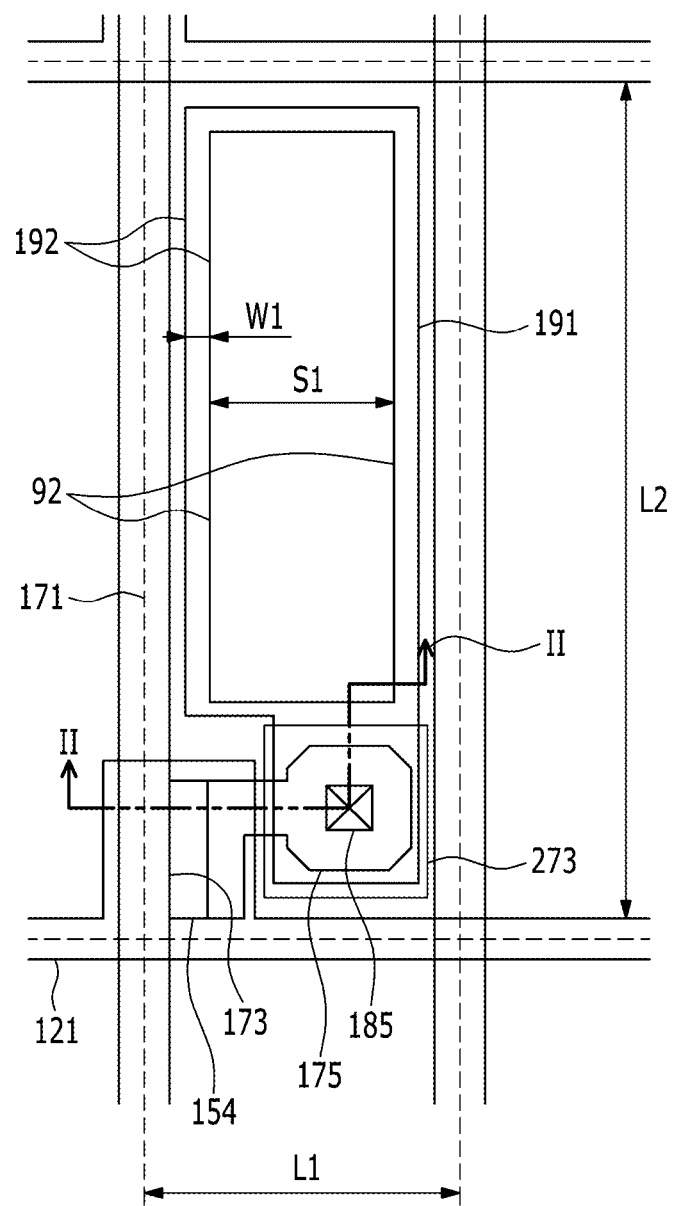
FIG. 1 shows a plan view of an exemplary embodiment of a liquid crystal display ("LCD") according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A liquid crystal display ("LCD") according to an exemplary embodiment of the invention will now be described with reference to accompanying drawings.

An LCD according to an exemplary embodiment of the invention will now be described with reference to FIGS. 1 and 2. FIG. 1 shows a plan view of an LCD according to an exemplary embodiment of the invention, and FIG. 2 shows a cross-sectional view of the LCD of FIG. 1 with respect to line II-II.

Figure 2:
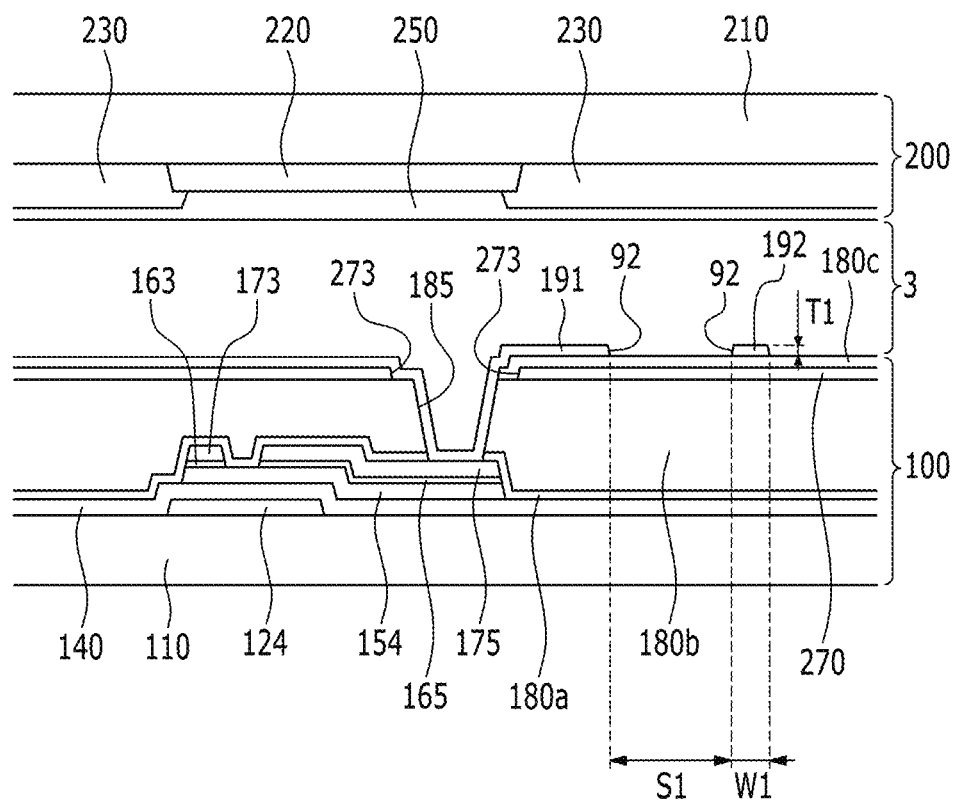
FIG. 2 shows a cross-sectional view of an LCD of FIG. 1 with respect to line II-II.

Referring to FIGS. 1 and 2, the LCD includes a first display panel 100 and a second display panel 200 facing each other, and a liquid crystal layer 3 injected therebetween. Although one pixel area is exemplified in the following description, the LCD according to an exemplary embodiment of the invention may have resolution of about 200 pixels per inch (PPI) or more. That is, about 200 or more pixels may be included in an area of 1 inch×1 inch on the LCD. Further, one pixel of the LCD according to an exemplary embodiment of the invention may have a horizontal width L1 that is equal to or less than about 40 micrometers (μm) and a perpendicular length L2 that is equal to or less than about 120 μm, for example. Here, as shown in the drawings, the horizontal length L1 of the pixel is a gap between perpendicular center portions of two adjacent data lines 171, and the perpendicular length L2 of the pixel is a gap between horizontal center portions of two adjacent gate lines 121.

The first display panel 100 will now be described.

A gate conductor including a gate line 121 is disposed on a first substrate 110 including transparent glass or plastic, for example.

The gate line 121 includes a wide end portion (not shown) for accessing a gate electrode 124 and another layer or an external driving circuit. In an exemplary embodiment, the gate line 121 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. However, the invention is not limited thereto, and the gate line 121 may have a multilayer structure including at least two conductive layers with different physical properties.

A gate insulating layer 140 including a silicon nitride (SiNx) or a silicon oxide (SiOx) is disposed on the gate conductor 121. In an exemplary embodiment, the gate insulating layer 140 may have a multilayer structure including at least two insulating layers with different physical properties.

A semiconductor 154 including amorphous silicon or polysilicon is disposed on the gate insulating layer 140. In an exemplary embodiment, the semiconductor 154 may include an oxide semiconductor.

Ohmic contacts 163 and 165 are disposed on the semiconductor 154. In an exemplary embodiment, the ohmic contacts 163 and 165 may include a material such as n+ hydrogenated amorphous silicon in which an n-type impurity such as phosphorus is doped at a high concentration, or a silicide. The ohmic contacts 163 and 165 may form a pair to be disposed on the semiconductor 154. When the semiconductor 154 is an oxide semiconductor, the ohmic contacts 163 and 165 may be omitted.

A data conductor including a data line 171 including a source electrode 173 and a drain electrode 175 is disposed on the ohmic contacts 163 and 165 and the gate insulating layer 140.

The data line 171 includes a wide end portion (not shown) for accessing another layer or an external driving circuit. The data line 171 transmits a data signal and is mainly extended in a perpendicular direction to cross the gate line 121.

The source electrode 173 is a part of the data line 171 and is disposed on the same line as the data line 171. The drain electrode 175 is provided to be parallel with the source electrode 173. Therefore, the drain electrode 175 is parallel with part of the data line 171.

The gate electrode 124, the source electrode 173, and the drain electrode 175 form a single TFT together with the semiconductor 154, and a channel of the TFT is disposed on the semiconductor 154 between the source electrode 173 and the drain electrode 175.

The LCD according to the exemplary embodiment of the invention includes the source electrode 173 positioned on the same line as the data line 171 and the drain electrode 175 extending parallel to the data line 171 so that the width of the TFT may be widened without increasing an area of the data conductor, thereby increasing the aperture ratio of the LCD.

The data line 171 and the drain electrode 175 may preferably include a refractory metal such as molybdenum, chromium, tantalum, titanium, or an alloy thereof, and they may have a multilayer structure including a refractory metal layer (not shown) and a low resistance conductive layer (not shown). An example of the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the invention is not limited thereto, and the data line 171 and the drain electrode 175 may be manufactured with various other kinds of metal or conductors. In an exemplary embodiment, a width of the data line 171 may be about 3.5 micrometers ($\mu$m)±0.75 $\mu$m.

A first passivation layer 180a is disposed on the data conductors 171, 173, and 175, the gate insulating layer 140, and an exposed portion of the semiconductor 154. The first passivation layer 180a may be provided with an organic insulating material or an inorganic insulating material.

A second passivation layer 180b is disposed on the first passivation layer 180a. In another exemplary embodiment, the second passivation layer 180b may be omitted. In an exemplary embodiment, the second passivation layer 180b may be a color filter. When the second passivation layer 180b is a color filter, the second passivation layer 180b may uniquely express one of primary colors which exemplarily include red, green, and blue, or yellow, cyan, and magenta, for example. Although not shown, the color filter may further include a color filter for displaying mixed colors of the primary colors or white.

A common electrode 270 is disposed on the second passivation layer 180b. The common electrode 270 with a planar shape may be disposed on the entire surface of the substrate 110 as a whole plate, and a first opening 273 is defined in the common electrode 270 in a region corresponding to a periphery of the drain electrode 175. That is, the common electrode 270 may have a plate-type plane form.

Common electrodes 270 provided to adjacent pixels are connected to each other and receive a predetermined common voltage supplied from outside of the display area.

A third passivation layer 180c is disposed on the common electrode 270. The third passivation layer 180c may be provided with an organic insulating material or an inorganic insulating material.

A pixel electrode 191 is disposed on the third passivation layer 180c. A first cutout 92 is defined in the pixel electrode 191, and the pixel electrode 191 includes a plurality of first branch electrodes 192 defined by the first cutout 92 and an edge of the pixel electrode 191.

The first branch electrodes 192 are extended in parallel with the data line 171.

In an exemplary embodiment, a first width W1 of the first branch electrode 192 may be equal to or less than about 2 $\mu$m, or equal to or less than about 1.5 $\mu$m, for example. In further detail, the width of the first branch electrode 192 may be equal to or less than about 1 $\mu$m, and the width of the first branch electrode 192 may be equal to or less than about 0.5 $\mu$m, for example.

The first width W1 of the first branch electrode 192 is less than a first gap S1 between the two adjacent first branch electrodes 192. In further detail, a ratio (W1/S1) of a first width W1 of the first branch electrode 192 to the first gap S1 between the two adjacent first branch electrodes 192 is less than about 1, and in detail, it may have a value between about 0.025 and about 1.

As described above, deterioration of transmittance that may occur in the center portion of the first branch electrode 192 may be prevented by forming the first width W1 of the first branch electrode 192 to be less than the gap S1 between the two adjacent first branch electrodes 192, which will be described in detail later.

A first thickness T1 of the first branch electrode 192 may be equal to or less than about 4,000 angstroms (Å). In detail, the first thickness T1 of the first branch electrode 192 may be equal to or less than about 2,000 Å. By forming the first thickness T1 of the first branch electrode 192 to be thin as described, a maximum gap between an upper edge of the first branch electrode 192 and the common electrode 270 overlapping the pixel electrode 191 is reduced and an influence of the horizontal component of the fringe field generated between the common electrode 270 and of the first branch electrode 192 is increased. As the horizontal component of the fringe field applied to the liquid crystal molecules is increased in size, transmittance of the LCD is increased.

Also, by forming the first thickness T1 of the first branch electrode 192 to be thin, a height of the first branch electrode 192 with respect to a lateral side is reduced. Accordingly, a height of an alignment layer (not shown) for covering a lateral portion of the first branch electrode 192 is reduced. The liquid crystal molecules provided around the alignment layer further tend to maintain the initial alignment state of the alignment layer. When the first thickness T1 of the first branch electrode 192 is formed to be relatively thick, the height of the alignment layer formed on the lateral side of the first branch electrode 192 is increased and a torque of the liquid crystal molecules provided on the lateral portion of the first branch electrode 192 may be reduced. However, according to the LCD according to an embodiment of the present invention, by forming the first thickness T1 of the first branch electrode 192 to be thin, the height of the lateral portion of the first branch electrode 192 is reduced and the height of the alignment layer formed on the lateral portion of the first branch electrode 192 is reduced. Therefore, a force for the liquid crystal molecules provided close to the lateral portion of the first branch electrode 192 to maintain the initial alignment state is weakened so the liquid crystal molecules may be easily rotated by the influence of the fringe field, and transmittance of the LCD may be increased by the easy rotation of the liquid crystal molecules.

A first contact hole 185 for exposing the drain electrode 175 is defined in the first passivation layer 180a, the second passivation layer 180b, and the third passivation layer 180c. The pixel electrode 191 is physically and electrically connected to the drain electrode 175 through the first contact hole 185, and receives a voltage from the drain electrode 175.

Although not shown, an alignment layer may be applied to the pixel electrode 191 and the third passivation layer 180c. In an exemplary embodiment, the alignment layer may be a horizontal alignment layer, and it may be rubbed in a predetermined direction. However, according to an LCD according to another exemplary embodiment of the invention, the alignment layer may include a photoreactive material and may be optically aligned.

The second display panel 200 will now be described.

A light blocking member 220 is disposed on a second substrate 210 including transparent glass or plastic, for example. The light blocking member 220, also called a black matrix, prevents light leakage.

A plurality of color filters 230 is disposed on the substrate 210. When the second passivation layer 180b of the first display panel 100 is a color filter, the color filter 230 of the second display panel 200 may be omitted. Further, in another exemplary embodiment, the light blocking member 220 of the second display panel 200 may be disposed on the first display panel 100.

An overcoat 250 is disposed on the color filter 230 and the light blocking member 220. In an exemplary embodiment, the overcoat 250 may include an (organic) insulating material, and prevents exposure of the color filter 230 and provides a flat surface. In another exemplary embodiment, the overcoat 250 may be omitted.

An alignment layer may be disposed on the overcoat 250.

The liquid crystal layer 3 includes a liquid crystal material having positive dielectric anisotropy or negative dielectric anisotropy. A long-axis direction of the liquid crystal molecules of the liquid crystal layer 3 is parallel to the display panels 100 and 200.

The pixel electrode 191 receives a data voltage from the drain electrode 175, and the reference electrode 270 receives a reference voltage from a reference voltage supply unit disposed outside the display area.

The pixel electrode 191 and the reference electrode 270 generate electric fields so that the liquid crystal molecules of the liquid crystal layer 3 provided on the electrodes 191 and 270 are rotated in a direction that is parallel to the direction of the electric field. As described above, according to the determined rotation direction of the liquid crystal molecules, polarization of light passing through the liquid crystal layer is changed.

Figure 3:
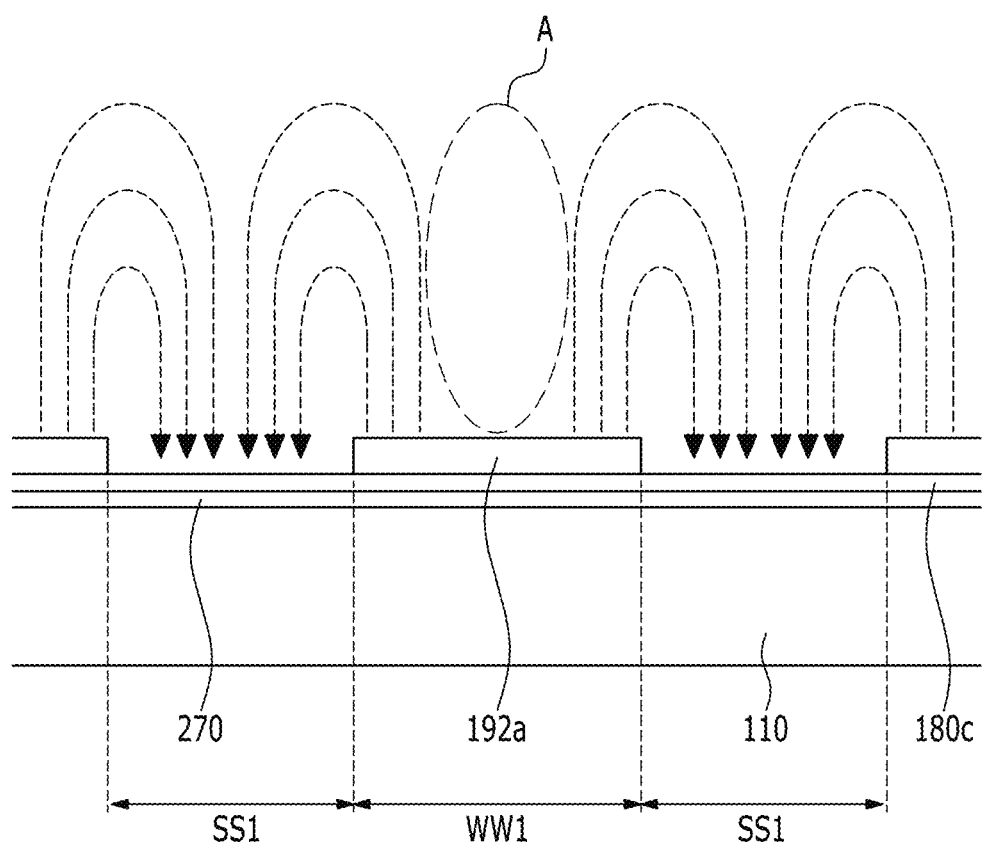
FIG. 3 shows a schematic view of an electric field applied to a liquid crystal layer of a conventional LCD.
Figure 4:
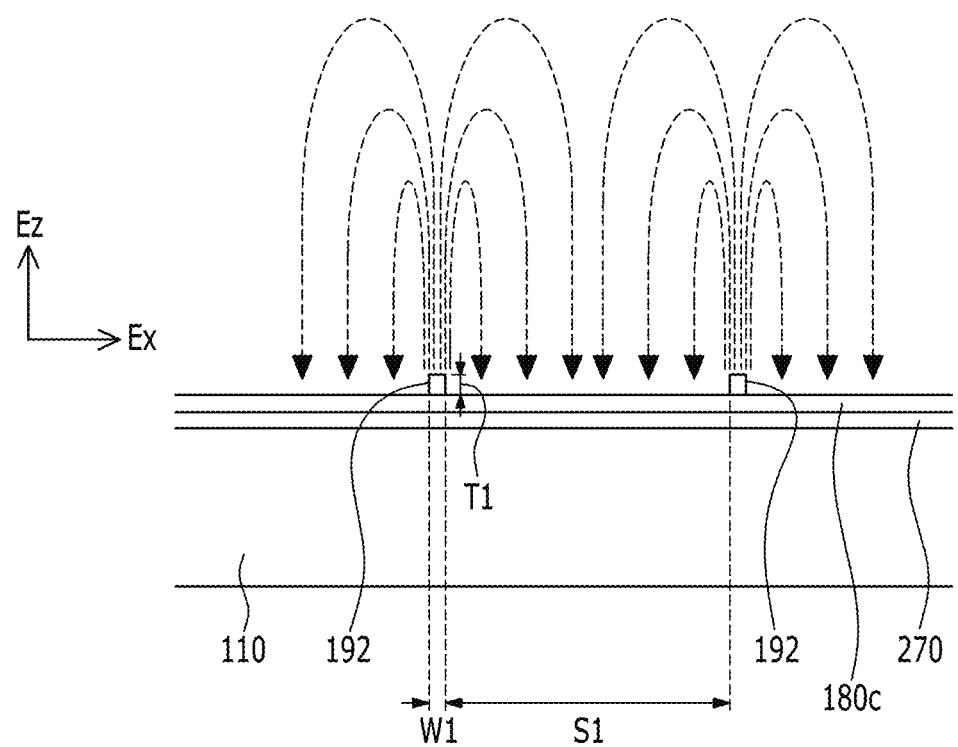
FIG. 4 shows a schematic view of an exemplary embodiment of an electric field applied to a liquid crystal layer of an LCD according to the invention.

As described above, deterioration of transmittance that may occur at the center portion of the first branch electrode 192 may be prevented by forming the first width W1 of the first branch electrode 192 to be less than the gap S1 between the two adjacent first branch electrodes 192, which will now be described with reference to FIGS. 3 and 4. FIG. 3 shows a schematic view of an electric field applied to a liquid crystal layer of a conventional LCD, and FIG. 4 shows a schematic view of an electric field applied to a liquid crystal layer of an LCD according to an exemplary embodiment of the invention.

FIG. 3 shows, in a like manner of the existing LCD, a case in which a second width WW1 of the branch electrode 192a of the pixel electrode 191 overlapping the common electrode 270 is provided to be substantially equal to or greater than a second gap SS1 between the two adjacent branch electrodes 192a.

When the common voltage and the data voltage are applied to the common electrode 270 and the pixel electrode 191, respectively, an electric field is generated between the common electrode 270 and a branch electrode 192a. In this instance, the electric fields generated on respective edge portions of the branch electrode 192a have a same level and opposite directions so the electric fields give no influence to the center portion (A) of the branch electrode 192a having a wide second width WW1.

Therefore, the liquid crystal molecules of the liquid crystal layer 3 provided at a position that corresponds to the center portion (A) of the branch electrode 192a are not rotated in a desired direction so transmittance of the LCD is reduced.

FIG. 4 shows a case in which the first width W1 of the first branch electrode 192 of the pixel electrode 191 overlapping the common electrode 270 is provided to be less than the first gap S1 between the two adjacent first branch electrodes 192 in a like manner of the LCD according to an exemplary embodiment of the invention.

As shown in FIG. 4, the first width W1 of the first branch electrode 192 is provided to be narrow so the center portion of the first branch electrode 192 is influenced by the electric field. Therefore, the liquid crystal molecules of the liquid crystal layer 3 that corresponds to the center portion of the first branch electrode 192 are rotated in a desired direction according to an influence of the electric field, and the transmittance is not deteriorated in the center portion of the first branch electrode 192.

Further, by forming the first thickness T1 of the first branch electrode 192 to be thin, the influence of the horizontal component (Ex) of the fringe field is increased compared to the vertical component (Ez) of the fringe field applied between the edge of the first branch electrode 192 and the common electrode 270 overlapping the pixel electrode 191. As the horizontal component (Ex) of the fringe field applied to the liquid crystal molecules is increased in size, transmittance of the liquid crystal device is increased.

A method for forming a narrow and thin branch electrode according to a method for manufacturing an LCD according to an exemplary embodiment of the invention will now be described with reference to FIGS. 5 to 9. FIGS. 5 to 9 sequentially show cross-sectional views of a method for manufacturing an LCD according to an exemplary embodiment of the invention.

Figure 5:
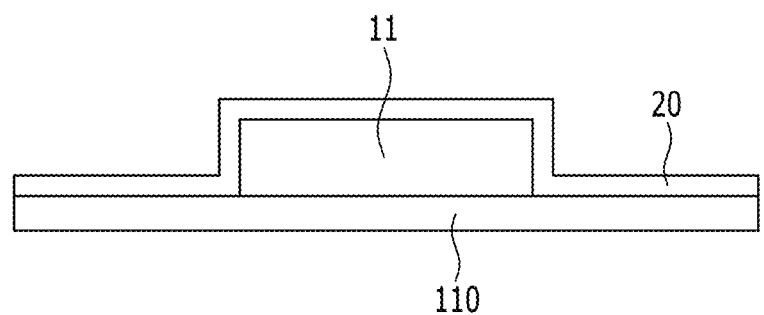
FIGS. 5 to 9 sequentially show cross-sectional views of an exemplary embodiment of a method for manufacturing an LCD according to the invention.

As shown in FIG. 5, a sacrificial layer 11 is disposed on the substrate 110, and a first conductive layer 20 is stacked thereon. The first conductive layer 20 forms a pixel electrode. The sacrificial layer 11 is provided to have a same width as the gap between the branch electrodes.

Figure 6:
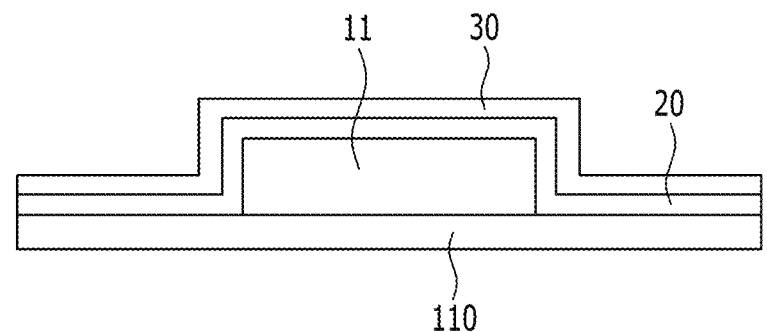

Referring to FIG. 6, a second conductive layer 30 is disposed on the first conductive layer 20. In an exemplary embodiment, the second conductive layer 30 may be aluminum, for example.

Figure 7:
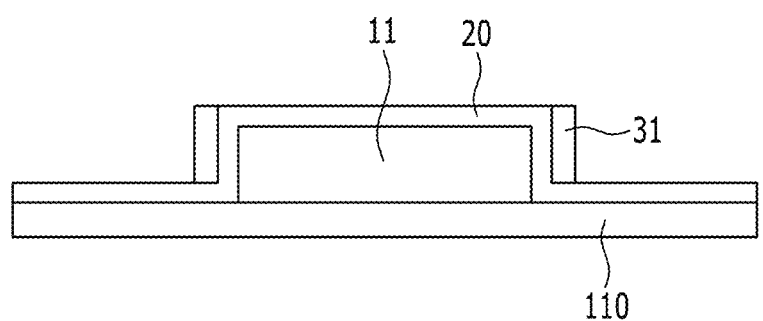
Figure 8:
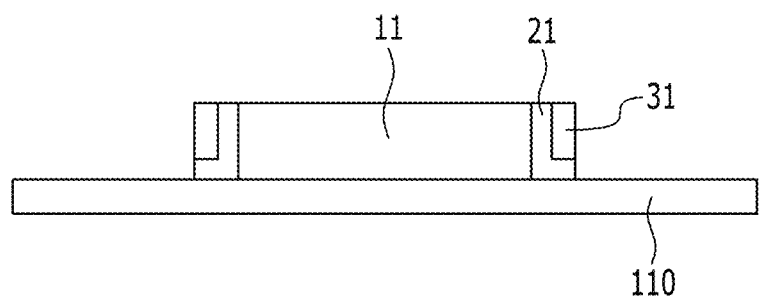

As shown in FIG. 7, the second conductive layer 30 is dry-etched to form a first pattern 31 for covering a side of the first conductive layer 20, and the first conductive layer 20 is wet-etched with the first pattern 31 as an etching mask to form a branch electrode pattern 21 as shown in FIG. 8.

Figure 9:
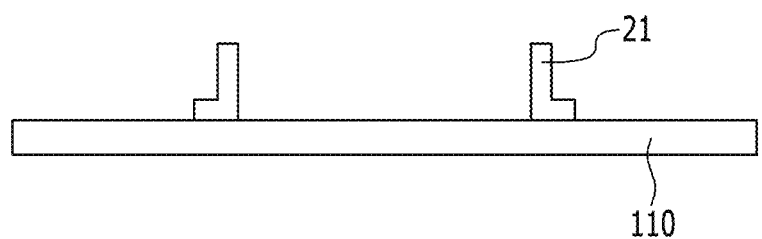

Finally, the first pattern 31 and the sacrificial layer 11 are removed to complete the branch electrode pattern 21 with a desired width as shown in FIG. 9.

By the above-noted method, the narrow and thin branch electrode is provided.

Figure 10:
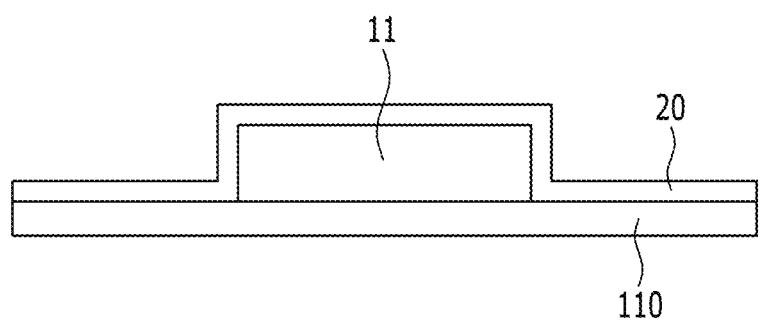
FIGS. 10 to 12 sequentially show cross-sectional views of another exemplary embodiment of a method for manufacturing an LCD according to the invention.
Figure 11:
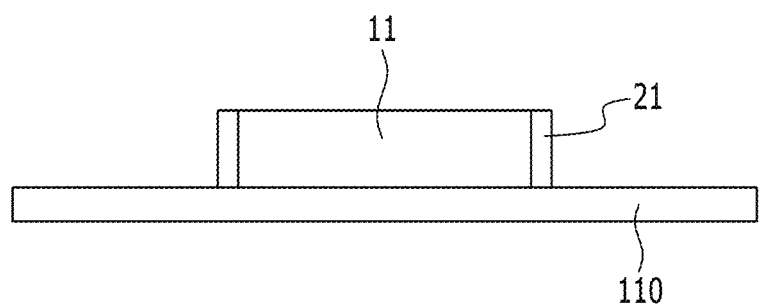
Figure 12:
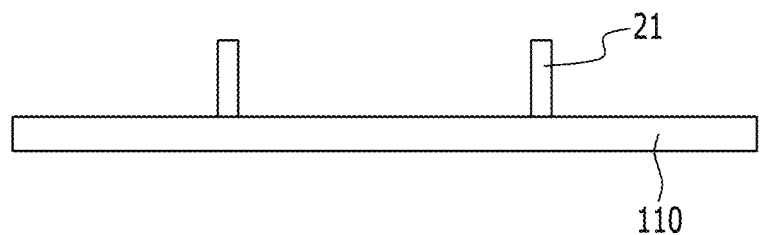

A method for forming a narrow and thin branch electrode according to a method for manufacturing an LCD according to another exemplary embodiment of the invention will now be described with reference to FIGS. 10 to 12. FIGS. 10 to 12 sequentially show cross-sectional views of a method for manufacturing an LCD according to another exemplary embodiment of the invention.

Referring to FIG. 10, a sacrificial layer 11 is disposed on the substrate 110, and a first conductive layer 20 is stacked thereon. The first conductive layer 20 forms a pixel electrode. The sacrificial layer 11 is provided to have a same width as the gap between the branch electrodes.

As shown in FIG. 11, the first conductive layer 20 is etched to remove the first conductive layer 20 provided on the sacrificial layer 11 and the substrate 110, and form a branch electrode pattern 21 on the side of the sacrificial layer 11.

As shown in FIG. 12, the sacrificial layer 11 is removed to complete the branch electrode pattern 21 with a desired width.

By this method, the narrow and thin branch electrode is provided.

Figure 13:
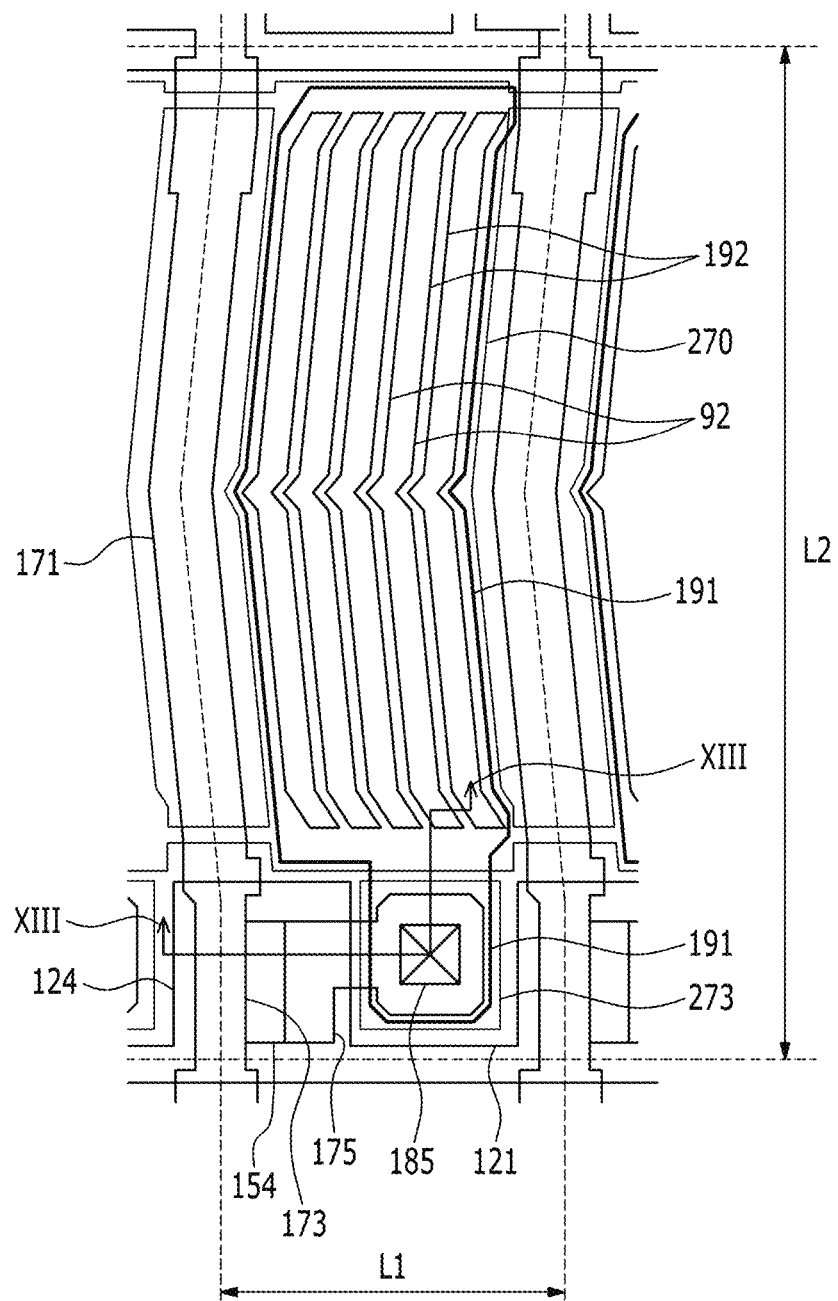
FIG. 13 shows a plan view of another exemplary embodiment of an LCD according to the invention.
Figure 14:
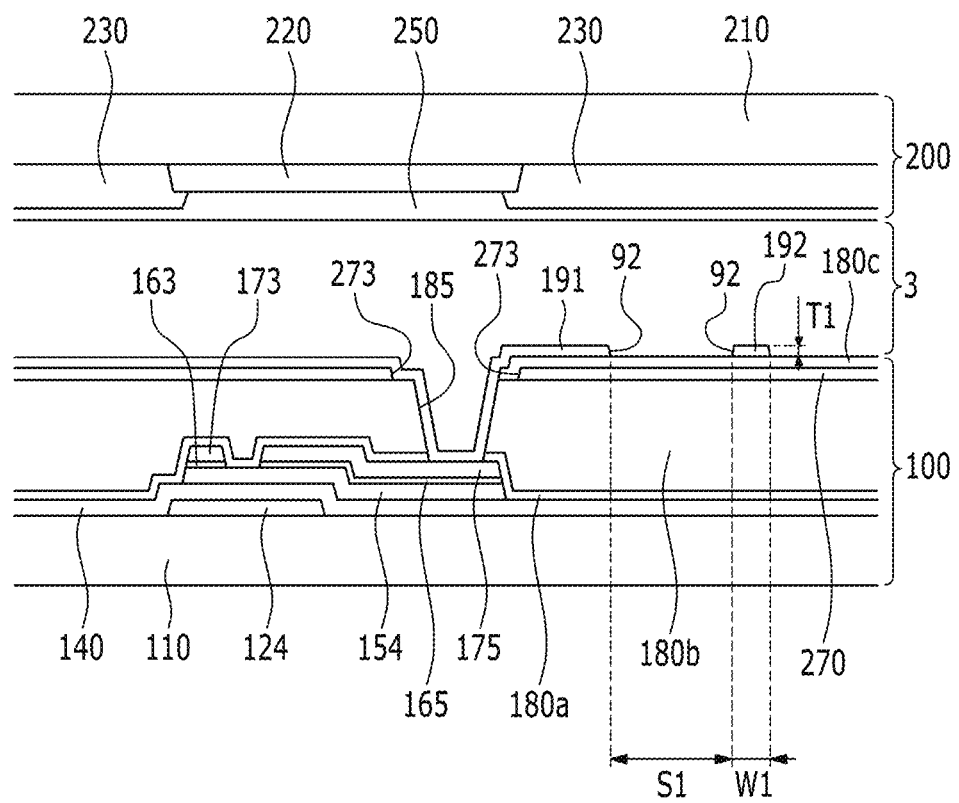
FIG. 14 shows a cross-sectional view of an LCD of FIG. 13 with respect to line XIII-XIII.

An LCD according to another exemplary embodiment of the invention will now be described with reference to FIGS. 13 and 14. FIG. 13 shows a plan view of an LCD according to another exemplary embodiment of the invention, and FIG. 14 shows a cross-sectional view of an LCD of FIG. 13 with respect to line XIII-XIII.

Referring to FIGS. 1 and 2, the LCD includes a first display panel 100 and a second display panel 200 facing each other, and a liquid crystal layer 3 injected therebetween. Although one pixel area is exemplified in the following description, the LCD according to an exemplary embodiment of the invention may have resolution of about 200 PPI or more. That is, about 200 or more pixels may be included in an area of 1 inch×1 inch on the LCD. Further, one pixel of the LCD according to an exemplary embodiment of the invention may have a horizontal width L1 that may be equal to or less than about 40 µm and a perpendicular length L2 that may be equal to or less than about 120 µm. Here, as shown in the drawings, the horizontal length L1 of the pixel is a gap between perpendicular center portions of the two adjacent data lines 171, and the perpendicular length L2 of the pixel is a gap between horizontal center portions of the two adjacent gate lines 121.

The first display panel 100 will now be described.

A gate conductor including a gate line 121 is disposed on a first substrate 110 including transparent glass or plastic, for example.

The gate line 121 includes a wide end portion (not shown) for accessing a gate electrode 124 and another layer or an external driving circuit. In an exemplary embodiment, the gate line 121 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. However, the invention is not limited thereto, and the gate line 121 may have a multilayer structure including at least two conductive layers with different physical properties.

A gate insulating layer 140 including a silicon nitride (SiNx) or a silicon oxide (SiOx) is disposed on the gate conductor 121. The gate insulating layer 140 may have a multilayer structure including at least two insulating layers with different physical properties.

A semiconductor 154 including amorphous silicon or polysilicon is disposed on the gate insulating layer 140. In an exemplary embodiment, the semiconductor 154 may include an oxide semiconductor.

Ohmic contacts 163 and 165 are disposed on the semiconductor 154. The ohmic contacts 163 and 165 may include a material such as n+ hydrogenated amorphous silicon in which an n-type impurity such as phosphorus is doped at a high concentration, or a silicide. In an exemplary embodiment, the ohmic contacts 163 and 165 may form a pair to be disposed on the semiconductor 154. When the semiconductor 154 is an oxide semiconductor, the ohmic contacts 163 and 165 may be omitted.

A data conductor including a data line 171 including a source electrode 173 and a drain electrode 175 is disposed on the ohmic contacts 163 and 165 and the gate insulating layer 140.

The data line 171 includes a wide end portion (not shown) for accessing another layer or an external driving circuit. The data line 171 transmits a data signal and is mainly extended in a perpendicular direction to cross the gate line 121.

In this instance, the data line 171 includes a first curved portion that is bent to acquire maximum transmittance of the LCD, and the curved portion may meet the middle region of the pixel area to form a V shape, for example.

The source electrode 173 is a part of the data line 171 and is disposed on the same line as the data line 171. The drain electrode 175 is provided to be parallel with the source electrode 173. Therefore, the drain electrode 175 is parallel with part of the data line 171.

The gate electrode 124, the source electrode 173, and the drain electrode 175 form a single TFT together with the semiconductor 154, and a channel of the TFT is disposed on the semiconductor 154 between the source electrode 173 and the drain electrode 175.

The LCD according to the exemplary embodiment of the invention includes the source electrode 173 positioned on the same line as the data line 171 and the drain electrode 175 extending parallel to the data line 171 so that the width of the TFT may be widened without increasing an area of the data conductor, thereby increasing the aperture ratio of the LCD.

In an exemplary embodiment, the data line 171 and the drain electrode 175 may preferably include a refractory metal such as molybdenum, chromium, tantalum, titanium, or an alloy thereof, and the data line 171 and the drain electrode 175 may have a multilayer structure including a refractory metal layer (not shown) and a low resistance conductive layer (not shown). An example of the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the invention is not limited thereto, and the data line 171 and the drain electrode 175 may be manufactured with various other kinds of metal or conductors. In an exemplary embodiment, a width of the data line 171 may be about 3.5 µm±0.75 µm.

A first passivation layer 180a is disposed on the data conductors 171, 173, and 175, the gate insulating layer 140, and an exposed portion of the semiconductor 154. The first passivation layer 180a may be provided with an organic insulating material or an inorganic insulating material.

A second passivation layer 180b is disposed on the first passivation layer 180a. In another exemplary embodiment, the second passivation layer 180b may be omitted. In an exemplary embodiment, the second passivation layer 180b may be a color filter. When the second passivation layer 180b is a color filter, the second passivation layer 180b may uniquely express one of primary colors which exemplarily include red, green, and blue, or yellow, cyan, and magenta, for example. Although not shown, the color filter may further include a color filter for displaying mixed colors of the primary colors or white.

A common electrode 270 is disposed on the second passivation layer 180b. The common electrode 270 with a planar shape may be disposed on the entire surface of the substrate 110 as a whole plate, and a first opening 273 is defined in the common electrode 270 in a region corresponding to a periphery of the drain electrode 175. That is, the common electrode 270 may have a plate-type plane form.

Common electrodes 270 provided to adjacent pixels are connected to each other and receive a predetermined common voltage supplied from outside of the display area.

A third passivation layer 180c is disposed on the common electrode 270. The third passivation layer 180c may be provided with an organic insulating material or an inorganic insulating material.

A pixel electrode 191 is disposed on the third passivation layer 180c. A first cutout 92 is defined in the pixel electrode 191, and the pixel electrode 191 includes a plurality of first branch electrodes 192 defined by the first cutout 92 and an edge of the pixel electrode 191.

The first branch electrodes 192 of the pixel electrode 191 have a curved edge that is substantially parallel to the curved portion of the data line 171. Respective end portions of the first branch electrode 192 of the pixel electrode 191 are bent with an angle that is different from that of the center portion.

A first width W1 of the first branch electrode 192 may be equal to or less than about 2 µm, or equal to or less than about 1.5 µm, for example. In further detail, the width of the first branch electrode 192 may be equal to or less than about 1 µm, or equal to or less than about 1 µm for example.

The first width W1 of the first branch electrode 192 is less than a first gap S1 between the two adjacent first branch electrodes 192. In further detail, a ratio (W1/S1) of a first width W1 of the first branch electrode 192 to the first gap S1 between the two adjacent first branch electrodes 192 is less than about 1, and in detail, it may have a value between about 0.025 and about 1.

As described above, deterioration of transmittance that may occur in the center portion of the first branch electrode 192 may be prevented by forming the first width W1 of the first branch electrode 192 to be less than the gap S1 between the two adjacent first branch electrodes 192.

A first thickness T1 of the first branch electrode 192 may be equal to or less than about 4,000 Å. In detail, the first thickness T1 of the first branch electrode 192 may be equal to or less than about 2,000 Å. By forming the first thickness T1 of the first branch electrode 192 to be thin as described, a maximum gap between an upper edge of the first branch electrode 192 and the common electrode 270 overlapping the pixel electrode 191 is reduced and an influence of the fringe field generated between the common electrode 270 and the first branch electrode 192 is increased. As the size of the fringe field applied to the liquid crystal molecules is increased, transmittance of the LCD is increased. Further, by forming the first thickness T1 of the first branch electrode 192 to be thin, a height of an alignment layer (not shown) for covering a lateral portion of the first branch electrode 192 is reduced. As a force for the liquid crystal molecules provided close to the lateral portion of the first branch electrode 192 to maintain the initial alignment state is weakened, the liquid crystal molecules may be easily rotated by the influence of the fringe field, and transmittance of the LCD may be increased by the easy rotation of the liquid crystal molecules.

A first contact hole 185 for exposing the drain electrode 175 is defined in the first passivation layer 180a, the second passivation layer 180b, and the third passivation layer 180c. The pixel electrode 191 is physically and electrically connected to the drain electrode 175 through the first contact hole 185, and receives a voltage from the drain electrode 175.

Although not shown, an alignment layer may be applied to the pixel electrode 191 and the third passivation layer 180c. In an exemplary embodiment, the alignment layer may be a horizontal alignment layer, and it may be rubbed in a predetermined direction. However, according to an LCD according to another exemplary embodiment of the invention, the alignment layer may include a photoreactive material and may be optically aligned.

The second display panel 200 will now be described.

A light blocking member 220 is disposed on a second substrate 210 including transparent glass or plastic, for example. The light blocking member 220, also called a black matrix, prevents light leakage.

A plurality of color filters 230 is disposed on the substrate 210. When the second passivation layer 180b of the first display panel 100 is a color filter, the color filter 230 of the second display panel 200 may be omitted. Further, in another exemplary embodiment, the light blocking member 220 of the second display panel 200 may be disposed on the first display panel 100.

An overcoat 250 is disposed on the color filter 230 and the light blocking member 220. The overcoat 250 may include an (organic) insulating material, and prevents exposure of the color filter 230 and provides a flat surface. In another exemplary embodiment, the overcoat 250 may be omitted.

An alignment layer may be disposed on the overcoat 250.

The liquid crystal layer 3 includes a liquid crystal material having positive dielectric anisotropy or negative dielectric anisotropy. In an exemplary embodiment, a long-axis direction of the liquid crystal molecules of the liquid crystal layer 3 may be parallel to the display panels 100 and 200.

The pixel electrode 191 receives a data voltage from the drain electrode 175, and the reference electrode 270 receives a reference voltage from a reference voltage supply unit disposed outside the display area.

The pixel electrode 191 and the reference electrode 270 generate electric fields so that the liquid crystal molecules of the liquid crystal layer 3 provided on the electrodes 191 and 270 are rotated in a direction that is parallel to the direction of the electric field. As described above, according to the determined rotation direction of the liquid crystal molecules, polarization of light passing through the liquid crystal layer is changed.

As described above, the first width W1 of the first branch electrode 192 is provided to be less than the first gap S1 so the center portion of the first branch electrode 192 is sufficiently influenced by the electric field. Therefore, the liquid crystal molecules of the liquid crystal layer 3 that correspond to the center portion of the first branch electrode 192 are rotated in a desired direction by the influence of the electric field so transmittance is not deteriorated in the center portion of the first branch electrode 192.

Figure 15A:
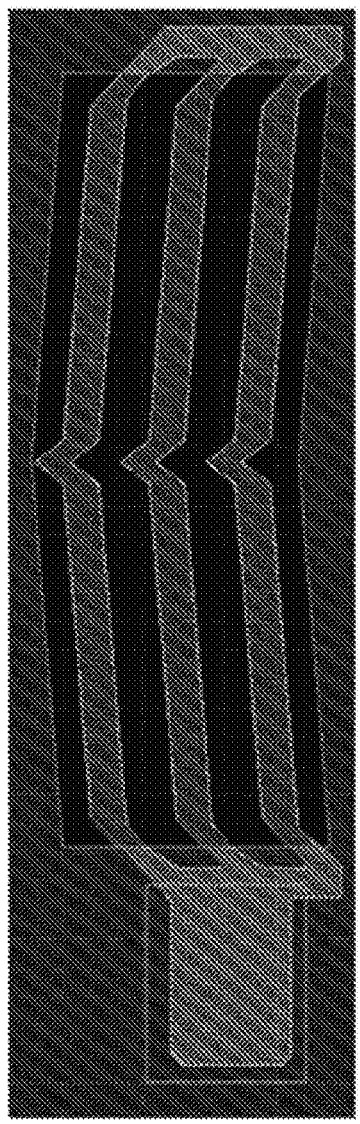
FIGS. 15A and 15B shows a transmittance result of an experimental example an LCD according to the invention.
Figure 15B:
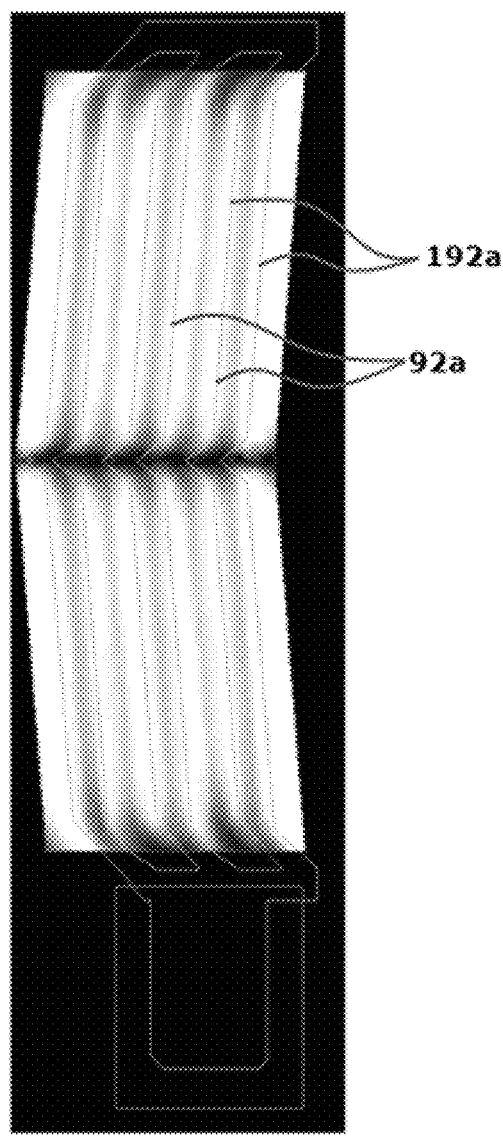

Transmittance of an LCD according to an experimental example of the invention will now be described with reference to FIGS. 15A, 15B, 16A and 16B. FIGS. 15A and 15B shows a transmittance result of an LCD according to an experimental example of the invention, and FIGS. 16A and 16B shows a transmittance result of an LCD according to an experimental example of the invention.

In the experimental example, regarding a first case in which the second width WW1 (See FIG. 3) of the branch electrode 192a is provided to be substantially equal to the second gap SS1 between the two adjacent branch electrodes 192a, and in detail, to be greater than about 2 µm in a like manner of the conventional LCD, and a second case in which the first width W1 (See FIG. 4) of the first branch electrode 192 of the pixel electrode 191 overlapping the common electrode 270 is provided to be less than the first gap S1 between the two adjacent first branch electrodes 192 and the first width W1 of the first branch electrode 192 is provided to be equal to or less than about 2 µm in a like manner of the LCD according to an exemplary embodiment of the invention, the common voltage and the data voltage are applied to the common electrode 270 and the pixel electrode 191, and transmittance results are measured with photographs taken by a scanning electron microscope.

FIGS. 15A and 15B show a result for the first case, wherein FIG. 15A shows a form of the pixel electrode 191, and FIG. 15B shows a photograph of a transmittance result taken by a scanning electron microscope.

Figure 16A:
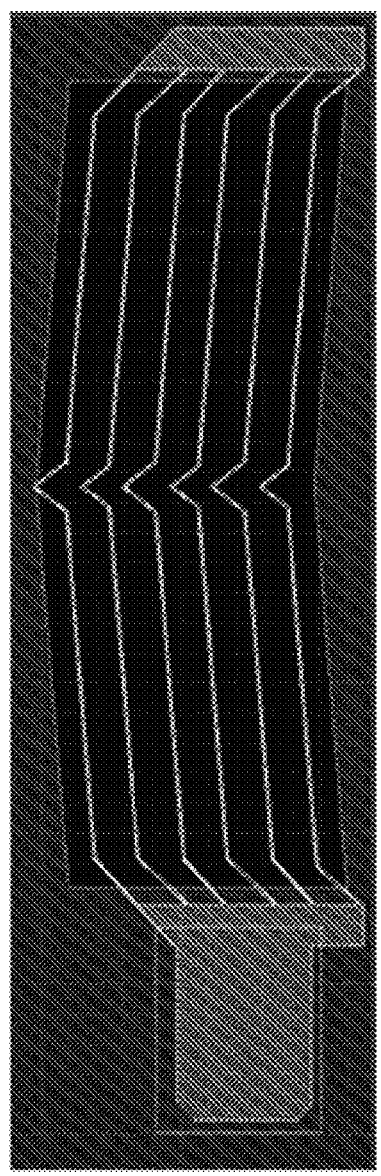
FIGS. 16A and 16B shows a transmittance result of an experimental example of an LCD according to the invention.
Figure 16B:
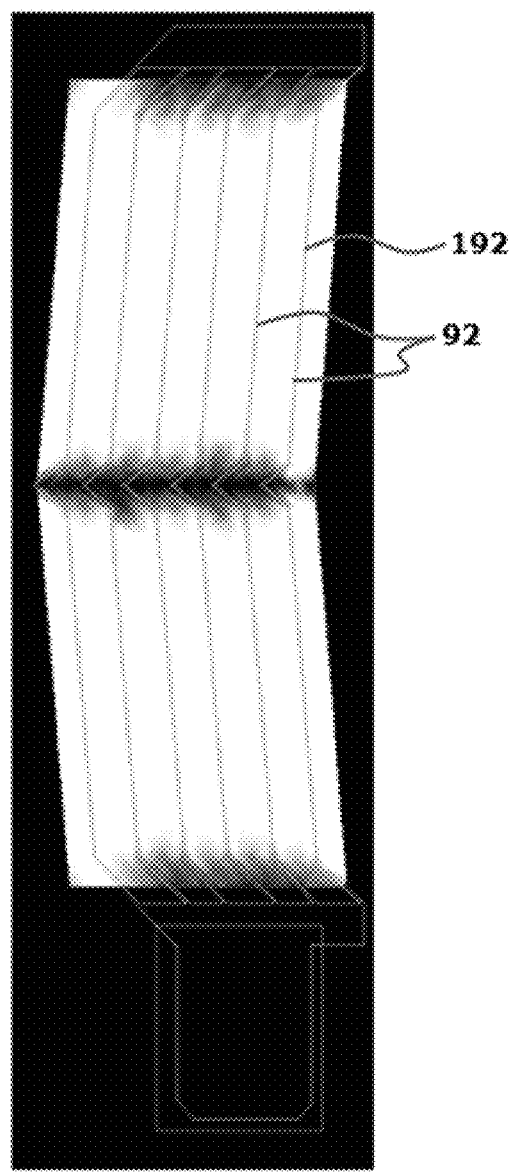

FIGS. 16A and 16B shows a result for the second case, wherein FIG. 16A shows a form of the pixel electrode 191, and FIG. 16B shows a photograph of a transmittance result taken by a scanning electron microscope.

Referring to FIGS. 15A and 15B, transmittance is deteriorated in a center portion of the branch electrode 192a of the pixel electrode 191 so a relatively darker portion is found in the center portion thereof.

On the contrary, referring to FIGS. 16A and 16B, transmittance is deteriorated around the first branch electrode 192 as well as the center portion of the first branch electrode 192 of the pixel electrode 191 so no dark portion is found.

Transmittance of an LCD according to another experimental example of the present invention will now be described with reference to FIG. 17. In the present experimental example, a gap between two adjacent first branch electrodes 192 is set to be about 3 µm, a width of the first branch electrodes 192 is changed, transmittance around the first branch electrodes 192 is measured, and a result is shown in FIG. 17.

Figure 17:
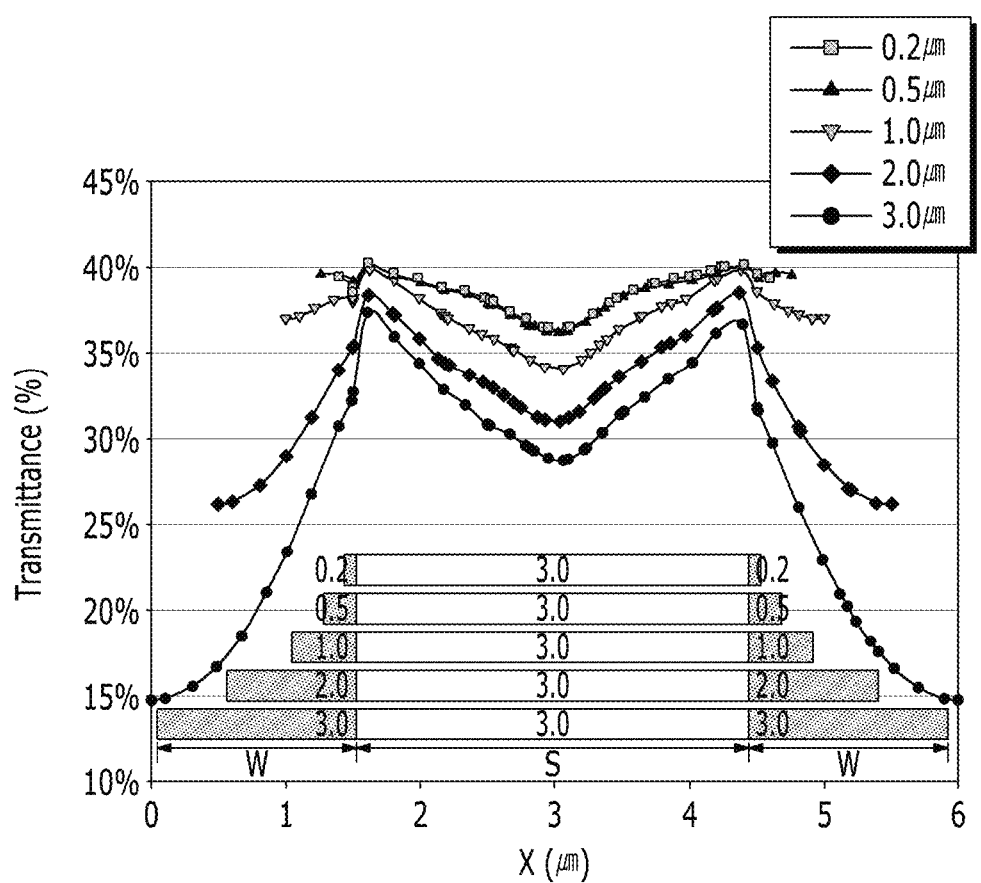
FIG. 17 shows a transmittance result of another experimental example of an LCD according to the invention.

Referring to FIG. 17, when the gap between the two adjacent first branch electrodes 192 is constant and the width of the first branch electrodes 192 is formed to be narrower, it is found that deterioration of transmittance on an upper portion of the first branch electrodes 192 and a separated portion between the two adjacent first branch electrodes 192 is reduced and the transmittance of the LCD is increased.

As described, according to the LCD according to the exemplary embodiment of the invention, the first width W1 of the first branch electrode 192 is provided to be less than the first gap S1, which is equal to or less than about 2 µm, equal to or less than about 1.5 µm, equal to or less than about 1 µm, or equal to or less than about 0.5 µm, the center portion of the first branch electrode 192 is sufficiently influenced by the electric field so the liquid crystal molecules of the liquid crystal layer 3 corresponding to the center portion of the first branch electrode 192 are rotated in a desired direction by the influence of the electric field, and transmittance is not deteriorated in the center portion of the first branch electrode 192. Further, by forming the width of the first branch electrode 192 to be narrow, it is found that deterioration of transmittance on the separated portion between the two adjacent first branch electrodes 192 is reduced and the transmittance of the LCD is increased.

Transmittance of an LCD according to another experimental example of the present invention will now be described with reference to FIG. 18. In the present experimental example, transmittance of the LCD is measured while changing a thickness of the first branch electrodes 192 and a gap between two adjacent first branch electrodes 192, and a result is shown in FIG. 18.

Figure 18:
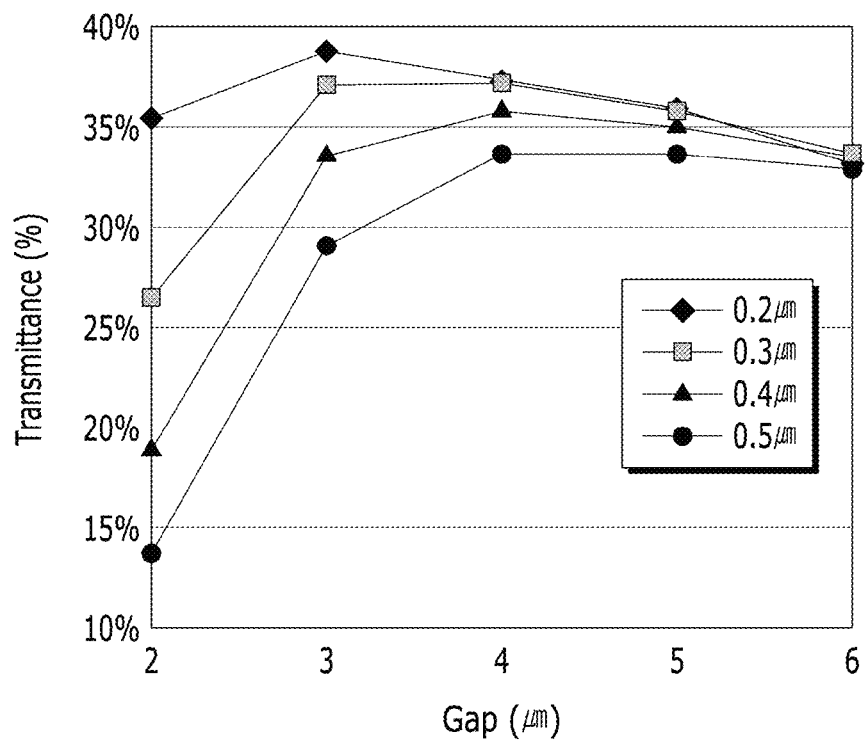
FIG. 18 shows a transmittance result of another experimental example of an LCD according to the invention.

Referring to FIG. 18, it is found that transmittance of the LCD is increased as the first branch electrodes 192 is formed to be thinner. In addition, it is found that, when the thickness of the first branch electrodes 192 is the same, transmittance of the LCD is reduced as a value of the gap between the two adjacent first branch electrodes 192 becomes greater than a constant value.

As shown in FIG. 18, when the thickness of the first branch electrode 192 is equal to or less than about 4,000 Å, in detail, when it is formed to be about 2,000 Å, it is found that transmittance of the LCD is increased, compared to the case in which the thickness of the first branch electrode 192 of the LCD is formed to be greater than about 4,000 Å.

When the value of the gap between the two adjacent first branch electrodes 192 is less than a constant value in FIG. 18, a size of a vertical component is increased compared to the horizontal component of the fringe field between the first branch electrodes 192 and the common electrode 270 overlapping the first branch electrodes 192, and it becomes difficult for the liquid crystal molecules to be rotated in the horizontal direction. Therefore, when the value of the gap between the two adjacent first branch electrodes 192 is less than the constant value, transmittance of the LCD may be reduced. In the present experimental example, transmittance of the LCD has a maximum value when the value of the gap between the two adjacent first branch electrodes 192 is about 3 µm.

Transmittance of an LCD according to another experimental example of the present invention will now be described with reference to FIG. 19. In the present experimental example, transmittance of the LCD is measured while changing the thickness of the first branch electrode 192 and a distance between the light blocking member 220 formed on an edge of a pixel region and the first branch electrode 192 provided on an outermost side of the pixel region, and a result is shown in FIG. 19.

Figure 19:
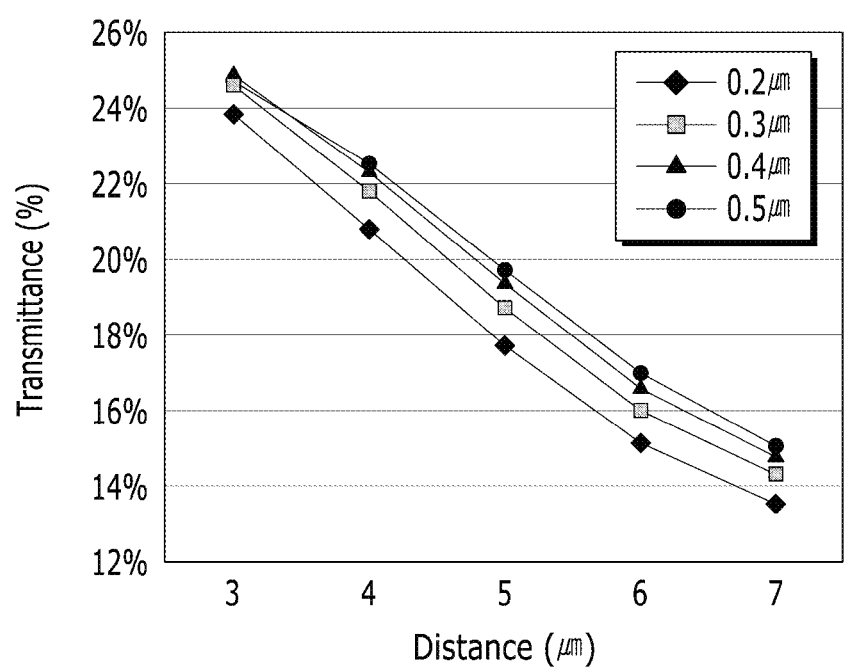
FIG. 19 shows a transmittance result of another experimental example of an LCD according to the invention.

Referring to FIG. 19, it is found that transmittance of the first branch electrode 192 provided on the outermost side of the pixel region is reduced when the first branch electrode 192 becomes thinner. When the first branch electrode 192 is thin, the size of the fringe field applied to the liquid crystal molecules is reduced on the edge of the pixel region. Therefore, the transmittance is reduced on the edge of the pixel region as the first branch electrode 192 becomes thinner. However, the edge of the pixel region does not substantially influence transmittance in the pixel region, so transmittance of the LCD liquid crystal display is not reduced when the first branch electrode 192 is thin.

It has been exemplified in the exemplary embodiment that the common electrode has a planar shape without an additional pattern in the pixel area and the pixel electrode includes a plurality of branch electrodes, but the invention is not limited thereto. That is, the pixel electrode may have a planar shape without an additional pattern in the pixel area and the common electrode may include a plurality of branch electrodes.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
   a first substrate;
   a gate line and a data line disposed on the first substrate;
   a thin film transistor connected to the gate line and the data line;
   a first insulating layer disposed on the gate line and the data line;
   a first electrode connected to the thin film transistor and having a flat form in a planar shape;
   a second insulating layer disposed on the first electrode; and
   a second electrode disposed on the second insulating layer and including a plurality of branch electrodes, wherein
   the branch electrodes are transparent,
   the branch electrodes overlap the first electrode, and
   a ratio of the width of the branch electrode to a gap between the two adjacent branch electrodes from among the plurality of branch electrodes is about 0.06 to about 0.16.

2. The liquid crystal display of claim 1, wherein
   a width of a branch electrode of the plurality of the electrodes is equal to or less than about 1 micrometer.

3. The liquid crystal display of claim 2, wherein
   the width of the branch electrode is equal to or less than about 0.5 micrometer.

4. The liquid crystal display of claim 3, wherein
   the plurality of branch electrodes is extended to be substantially parallel to the data line.

5. The liquid crystal display of claim 3, wherein
   a ratio of the width of the branch electrode to a gap between the two adjacent branch electrodes from among the plurality of branch electrodes is less than about 1.

6. The liquid crystal display of claim 5, wherein
   the width of the branch electrode is about 0.2 micrometer to about 0.5 micrometer and the gap between the two adjacent branch electrodes is about 3 micrometers.

7. The liquid crystal display of claim 6, wherein
   the plurality of branch electrodes is extended to be substantially parallel to the data line.

8. The liquid crystal display of claim 1, wherein
   a thickness of the branch electrode is equal to or less than about 2,000 angstroms.

9. The liquid crystal display of claim 8, wherein
   the width of the branch electrode is about 0.2 micrometer to about 0.5 micrometer and a gap between the two adjacent branch electrodes is about 3 micrometers.

10. The liquid crystal display of claim 9, wherein
    the plurality of branch electrodes is extended to be substantially parallel to the data line.

11. The liquid crystal display of claim 1, wherein
    the plurality of branch electrodes is extended to be substantially parallel to the data line.

* * * * *